Jan. 29, 1963 T. A. WEIL 3,076,131

MAGNETIC AMPLIFIER CIRCUITS

Filed May 29, 1959

INVENTOR
THOMAS A. WEIL
BY H. Vincent Harsha
ATTORNEY

3,076,131
MAGNETIC AMPLIFIER CIRCUITS

Thomas A. Weil, Wellesley Hills, Mass., assignor to Raytheon Company, Lexington, Mass., a corporation of Delaware Filed May 29, 1959, Ser. No. 816,858
2 Claims. (Cl. 321—25)

This invention relates to magnetic amplifiers and, more particularly, to improvements enabling magnetic amplifiers to perform with stability when used with inductive loads.

Magnetic amplifiers have been used to produce power amplification and to provide a relatively large direct current output in response to relatively small direct current input signals. A self-saturating magnetic amplifier feeding an inductive load is described in U.S. Patent No. 2,516,563 of W. L. O. Graves, issued July 25, 1950. The system of this invention constitutes an improvement over the aforementioned patent. While magnetic amplifiers of this type provide satisfactory operation when the load or output impedance into which they operate is essentially resistive, operation becomes unstable when such load becomes highly inductive. This is particularly true when a choke input type of filter is used and it becomes necessary to permit current to flow constantly through the choke throughout the entire working cycle of the magnetic amplifier. In order to permit current in the load choke to remain substantially continuous during the portion of the operating cycle when neither core of the magnetic amplifier is saturated, a diode, sometimes referred to as a free-wheeling diode is connected across the input side of the choke and the side of the load opposite to the choke. By this connection, current remaining in the choke at the end of each half-cycle of the magnetic amplifier flows through the diode rather than continuing through the magnetic amplifier. While a diode of this type improves operating stability, as seen in the aforementioned patent, the finite voltage drop in the diode during conduction produces a triggering or jumping of the output voltage from one direct current value to another direct current value, thereby making control of intermediate values of output voltage difficult or impossible to obtain. For example, attempts to reduce the output voltage to a desired value results in an inactive zone after which the voltage jumps from the low value to a value higher than desired. This effect prevents accurate control of voltages within that portion of the range over which triggering occurs. It is, therefore, an object of the invention to provide stable power amplification without the aforesaid triggering and in a manner which does not sacrifice power gain of the magnetic amplifier.

In accordance with the magnetic amplifier of the invention, the finite voltage drop present in the free-wheeling diode, normally used in connection with a full-wave magentic amplifier, is prevented from being applied to the magnetic amplifier by the introduction of an opposing or bias voltage to cancel out the undesired voltage drop. This is achieved in one embodiment of the invention by connecting the rectified output of the magnetic amplifier to a voltage tap on the winding of the output choke rather than to the input end of the choke. A free-wheeling diode remains connected between the input end of said choke and the side of the load opposite the choke. By tapping the choke in this manner, a compensating voltage is produced in the portion of the choke winding between the tap and the diode during current flow through the diode. As long as the compensating voltage exceeds the voltage drop of the diode, the net voltage has the polarity which does not tend to turn the full-wave rectifier diodes associated with the magnetic amplifier during their non-conducting half cycle. In this manner, therefore, accurate control over a relatively large and continuous range of output voltages is achieved, and, at the same time, the advantage of full gain of the magnetic amplifier can be realized even in the presence of an inductive load.

The invention further contemplates the provision of a compensating voltage to overcome the finite voltage drop of the free-wheeling diode by providing taps on both sides of the center-tap of the secondary winding of the transformer supplying power to the magnetic amplifier and by rectifying the voltage output produced by the tapped turns. In this instance, the diode rectifiers are connected to the taps and to the input side of the choke and poled to supply a small direct-current output voltage of the same polarity as the output voltage of the magnetic amplifier. By this connection, the rectifiers operate not only as bias rectifiers, but also as the free-wheeling diode. This embodiment is of particular value in supplying current to loads which are not purely passive, such as when the magnetic amplifier is used in a series circuit to boost the power output of a second source.

Other characteristics of the invention will be apparent upon reference to the following description of the embodiments of the invention schematically illustrated in the accompanying drawing, in which.

Figures 1, 2:
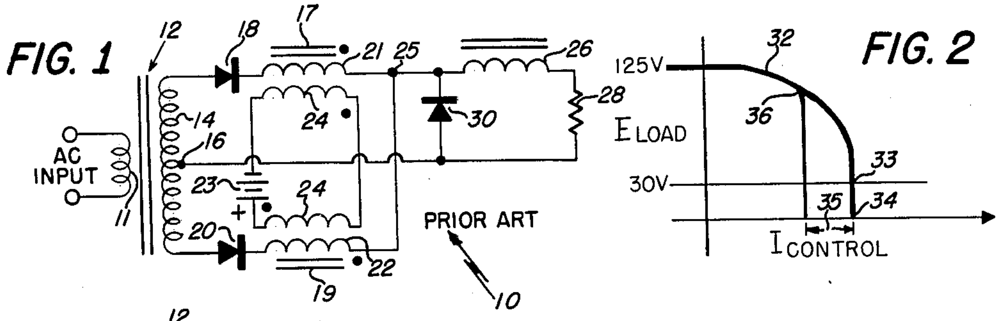
FIG. 1 is a schematic circuit diagram of a well-known magnetic amplifier incorporating a free-wheeling diode.
FIG. 2 is a curve showing the triggering effect in the input-output characteristic of FIG. 1.

FIG. 1 shows a well-known magnetic amplifier 10 in which primary winding 11 of transformer 12 may be connected to an alternating current source. A secondary winding 14 is adapted to provide voltages which preferably are equal and 180 degrees out of phase with each other, and also has a neutral or common connection 16 at the center tap of the transformer. The output voltage of the transformer is connected to direct current rectifiers 18 and 20 poled to apply direct current to the load through reactor coils 21 and 22. The magnetic amplifier, as illustrated, comprises two cores 17 and 19 of saturable magnetic material, as described in the above patent. First and second reactor windings 21 and 22 are connected in series with rectifiers 18 and 20. A direct current control winding 24 is connected to a source of direct current 23 which varies the flux in the cores to control the rectified voltage output of the magnetic amplifier. Connected to output point 25 between the first and second reactor windings is a choke coil 26, the output end of which is connected to a load represented by resistor 28. The center tap 16 of transformer 12 is connected to the other side of load 28, and a free-wheeling diode 30 is connected from the input side of choke 26 to the center tap 16 of transformer 12. When rectifiers 18 and 20 alternately cut off, current in choke 26 flows through diode 30. The finite voltage drop in this free-wheeling diode produces a voltage which flows back through the reactor coils and is applied to the rectifiers in the magnetic amplifier. This tends to turn on the rectifiers during a portion of their non-conductive half cycles resulting in the aforementioned instability and triggering.

FIG. 2 shows the effect of triggering on the output voltage for a given control current. For example, if it is desired to obtain an output voltage of 30 volts, control current in winding 24 is increased in a well-known manner in an attempt to lower the output voltage as shown in curve 32 to a point 33 representing 30 volts. However, before this point 33 can be reached, additional control current due to the effect of diode 30 causes the output voltage to jump to a value below 30 volts as seen at point 34. When the control current is decreased in an effort to retrace the voltage curve 32 to the desired 30 volt point, a back lash or dead zone 35 results, beyond which the load voltage jumps to a point 36 above the 30 volt level, thereby preventing accurate control of voltages within that portion of the range over which triggering occurs.

Figure 3:
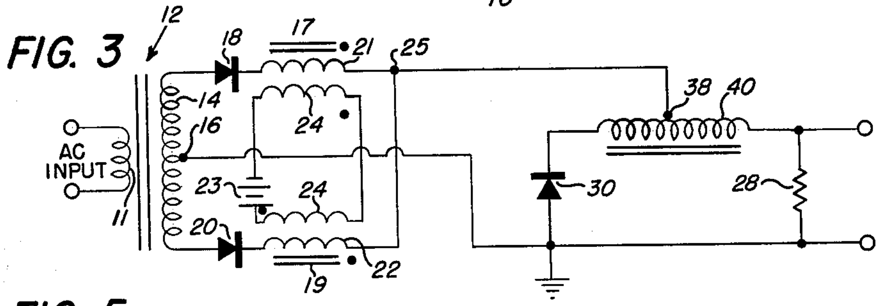
FIG. 3 is a schematic diagram of one embodiment of the invention.

In order to prevent the above-described triggering, the output of the magnetic amplifier at point 25, as shown in FIG. 3, is connected to a tap 38 on the winding of the choke 40. The free-wheeling diode 30 remains connected between the input end of the choke and the center-tap 16 of the transformer. By tapping the choke in this manner, a compensating voltage, as noted, is produced in the portion of the choke winding between the tap 38 and the diode 30. During current flow through the diode immediately following non-conduction of either of rectifiers 18 or 20, the compensating voltage produced in this portion of the choke cancels the voltage produced by the voltage drop in the diode so that the polarity at point 38 with respect to ground does not reverse. During that portion of the cycle when there is no output from the magnetic amplifier, the tendency of the load current to decrease induces a voltage between tap 38 and diode 30. This voltage has a polarity which opposes the voltage drop in diode 30. In this manner, triggering is eliminated, and accurate control is achieved over the entire range of output voltages.

Figure 4:
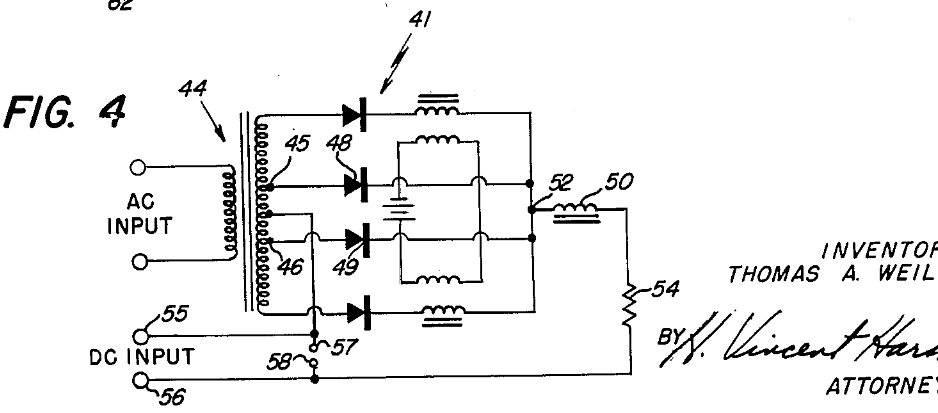
FIG. 4 is a schematic diagram of another embodiment of the invention, as applied to boost the output of another power source; and, FIG. 5 is a schematic diagram of an application of the embodiment of FIG. 4.

Referring now to FIG. 4, there is shown a magnetic amplifier circuit 41 which is a modification of the magnetic amplifier circuit of FIG. 3. This modification permits the magnetic amplifier to control a load which is not purely passive. In this embodiment, a compensating voltage to overcome the finite voltage drop of the free-wheeling diode is provided by means of a transformer 44 which has two additional connections 45 and 46. Rectifiers 48 and 49 are connected from these taps to choke 50. The voltage on these taps 45 and 46 is applied to diodes 48 and 49 which operate as free-wheeling diodes on alternate half cycles. On one half cycle the voltage at tap 45, and on the other half cycle the voltage at tap 46, is of the correct polarity to compensate for the voltage drop in the associated diode. Consequently, a tapped choke is not necessary. Thus, current at all times is allowed to continue to flow in choke 50 and alternately in diodes 48 and 49. This circuit, as noted, is particularly useful to regulate voltage when the load 54 is not purely passive, such as when the magnetic amplifier is used in a circuit in series with a source of direct current applied to input connections 55 and 56. However, the source of direct current may be disconnected and terminals 57 and 58 connected together when it is desired to connect the magnetic amplifier directly to a load.

Figure 5:
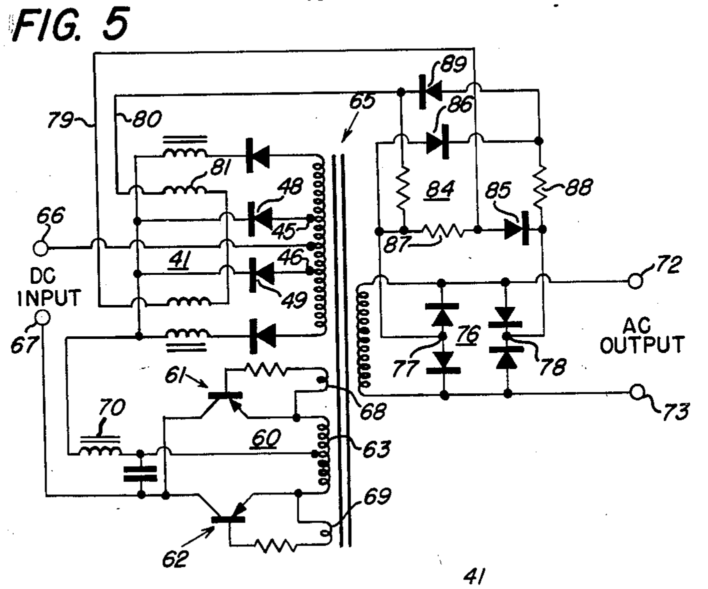

FIG. 5 shows a particular application of the magnetic amplifier circuit of FIG. 4. In particular, FIG. 5 discloses a magnetic amplifier 41 connected in a manner to control the voltage input to a direct-current-to-alternating-current inverter. In the inverter circuit 60, transistors 61 and 62 alternately are driven to conduction by feedback windings 68 and 69 to produce an alternating current output in winding 63 of transformer 65. An inverter circuit of this type is well-known and is described in detail in an article by Urchin and Taylor, entitled "A New Self-Excited Square-Wave Transistor Power Oscillator" in the January 1955, issue of the Proceedings of the IRE. The direct current input voltage to inverter 60 is maintained at a constant value, despite variations in the input voltage applied to terminals 66 and 67, by means of magnetic amplifier 41 which is connected to the common output transformer 65 of the transistor inverter. In particular, the inverter 60 is provided with an input choke 70 which is connected in series with the inverter 60, the magnetic amplifier 41 and the direct current input terminals 66 and 67. The alternating current output of the inverter is connected to output terminals 72 and 73. In order to maintain the input voltage to the inverter constant, and, thus, maintain the alternating current output voltage constant, a portion of the alternating current output is sampled and rectified in a well-known manner by a full wave bridge 76. The rectified output voltage appearing at terminals 77 and 78 is then compared with a zener diode reference voltage to produce an error voltage. This error voltage is fed back through leads 79 and 80 to the direct current control winding 81 of the magnetic amplifier 41. This in turn, controls the direct current input voltage to the inverter 60 to maintain a constant alternating current output voltage notwithstanding variations in the direct current input voltage or a change in the load applied to the output terminals 72 and 73. The zener diode reference network 84 includes zener diodes 85 and 86 which are connected in series with dropping resistors 87 and 88 across the rectified voltage output from bridge 76. Diode 89 is used to limit the amount of current supplied to control winding 81 during output voltage variations beyond the normal range of amplifier control. If the alternating current output voltage at terminals 72 and 73 increases beyond a desired value, a greater voltage difference results due to the comparison with the zener diode reference voltage and a larger current is applied to the control winding 81 of the magnetic amplifier. The amount of boosting voltage provided by the magnetic amplifier is thereby reduced, and, thus, the direct current input voltage to the inverter 60 is reduced, so that the output voltage of the inverter 60 approaches the desired level. In addition, during non-conduction of the rectifying diodes in the magnetic amplifier the current in the input choke 70 is permitted to continue to flow through diodes 48 and 49 and the voltage drop in these diodes is cancelled by the voltage at taps 45 and 46, in accordance with the invention. While the compensating voltage, as shown, is continuously provided over each half-cycle by the taps 45 and 46, it is to be understood that a bias source, such as provided by batteries, can be substituted for the compensating voltage source shown in FIGS. 4 and 5. However, in this instance, the separate bias source or batteries must be capable of supplying a current equal to the entire load current of the magnetic amplifier.

This invention is not limited to the particular details of construction, materials and processes described, as many equivalents will suggest themselves to those skilled in the art. It is accordingly desired that the appended claims not be limited to the particular details of the embodiment disclosed herein except as defined by the appended claims.

What is claimed is:

1. A magnetic amplifier regulating system for an inverter having direct current input and an alternating current output, a saturable core reactor having first and second reactor windings and a contol winding, the reactance of said reactor windings controlled by the direct current in the control winding, a direct-current to alternating-current inverter having input and output terminals, a source of direct current, a transformer having a pair of supply connections for providing two voltages 180 degrees out of phase with each other and a common connection, first and second taps on either side of said common connection, first and second rectifiers, said first and second reactor windings and said first and second rectifiers being electrically connected in series between said first and second alternating current supply connections on said transformer, an output choke connected to a point intermediate said first and second reactor windings and an input terminal of said inverter, one terminal of said direct current input source connected to said common connection on said transformer, the alternating current output of said inverter being inductively connected to said transformer and a secondary output winding on said transformer, and third and fourth rectifiers connected in series with said first and second taps on said transformer and a point intermediate said first and second reactor windings, whereby said magnetic amplifier is adapted to control the direct current input voltage of said inverter.

2. A magnetic amplifier regulating system for an inverter having direct current input and an alternating current output, a saturable core reactor having first and second reactor windings and a contol winding, the reactance of said reactor windings controlled by the direct current in the control winding, a direct-current to alternating-current inverter having input and output terminals, a source of direct current, a transformer having a pair of supply connections for providing two voltages 180 degrees out of phase with each other and a common connection, first and second taps on either side of said common connection, first and second rectifiers, said first and second reactor windings and said first and second rectifiers being electrically connected in series between said first and second alternating current supply connections on said transformer, a choke connected to a point intermediate said first and second reactor windings and an input terminal of said inverter, one terminal of said direct current input source connected to said common connection on said transformer, the alternating current output of said inverter inductively connected to said transformer and a secondary output winding on said transformer, third and fourth rectifiers connected in series with said first and second taps on said transformer and a point intermediate said first and second reactor windings, whereby said magnetic amplifier is adapted to control the direct current input voltage to said inverter, a voltage sensing circuit connected across said secondary output winding on said transformer for determining an error voltage, and a coupling means between the sensing circuit and the control winding in said saturable reactor which changes the reactance of said saturable reactor in response to the amplitude of the error voltage.

References Cited in the file of this patent

UNITED STATES PATENTS

| | | |
|---|---|---|
| 1,592,388 | Slepian | July 13, 1926 |
| 2,004,778 | Bedford | June 11, 1935 |
| 2,516,563 | Graves | July 25, 1950 |
| 2,783,380 | Bonn | Feb. 26, 1957 |

FOREIGN PATENTS

| | | |
|---|---|---|
| 738,222 | Great Britain | Oct. 12, 1955 |